Jan. 28, 1969 TAKEO NISHIMURA 3,423,821

METHOD OF PRODUCING THIN FILM INTEGRATED CIRCUITS

Filed March 9, 1966

INVENTOR
TAKEO NISHIMURA

BY Paul M. Craig, Jr.
ATTORNEY

United States Patent Office 3,423,821
Patented Jan. 28, 1969

3,423,821

METHOD OF PRODUCING THIN FILM INTEGRATED CIRCUITS

Takeo Nishimura, Tokyo, Japan, assignor to Hitachi, Ltd., Tokyo, Japan, a corporation of Japan Filed Mar. 9, 1966, Ser. No. 533,015
Claims priority, application Japan, Mar. 18, 1965, 40/15,329
U.S. Cl. 29—571 3 Claims
Int. Cl. H01l 7/60; B01j 17/02

ABSTRACT OF THE DISCLOSURE

A method for producing thin film integrated circuits including passive circuit elements and at least one active circuit element, including the successive steps of depositing a first layer of an anodizable metal on an insulator substrate, anodizing this first layer to form an oxide insulating film of a predetermined thickness on the surface of the first layer, depositing, by vapor deposition, and upper metal layer on the surface of the insulating film, removing portions of the first metal layer, insulating film and upper metal layer selectively, thus forming the desired passive circuit elements and the connections therebetween, and depositing, on a part of a group of the circuit elements thus formed, a semiconductor, thus forming an active circuit element.

The present invention relates to a method of producing a thin film integrated circuit and in more detail to a method of producing a thin film integrated circuit by a simple process using the same basic material, which comprises forming on an insulator substrate a multiple circuit including active circuit elements and passive circuit elements by means of thin film technique.

In the field of the semiconductor industry, the terms "active circuit element" and "passive circuit element" are generally used to mean an impedance network which operates as a current generator and an impedance network which does not operate as a current generator, respectively.

Examples of the active circuit element include photocells, transistors and diodes, while those of the passive circuit elements include resistances, condensers and coils.

Miniaturization of electronic circuitry is a general tendency in recent years, and development researches are now being conducted energetically for the formation of circuitry on the plane of the same substrate, utilizing the thin film technique. Such a planar formation of circuitry is generally achieved by two methods. One of them is a method of producing circuits by means of thin film technique in which conductive portions, resistances and the like are produced on an insulator substrate, such as ceramic or glass, by means of printing or vacuum evaporation and the other is a hybrid integrated circuit method in which transistors, diodes and the like are built in a semiconductor crystal substrate and the other components (passive circuit elements) are produced on the same substrate by means of evaporation or other suitable means.

The present invention is concerned with the former method, that is, the so-called thin film integrated circuit method, which comprises forming active circuit elements and passive circuit elements on an insulator substrate and connecting said circuit elements to each other by means of evaporation or other means in accordance with a predetermined electronic circuit, thereby to form a desired electronic circuit.

In the formation of an electronic circuit in the form of a thin film, heretofore, it has been practice to place on a substrate active circuit elements, such as transistors and diodes, which were prepared separately beforehand;

therefore, there were drawbacks that the circuit obtained involved a wasteful space of a height corresponding to that of these component elements, and was expensive and not reliable. In addition, while it was possible to produce the aforementioned passive circuit elements, such as resistances and condensers, by evaporation, these elements must have been produced on a substrate individually, each by a separate evaporation process according to the kind thereof, at their respective positions in a desired electronic circuit. This has rendered the production process complicated and hence added to the cost of production, and it is for this reason that the thin film circuit method has not been employed for practical application, although it has the advantage that the thin film circuit produced thereby is precise and has a high reliability.

An object of the present invention, therefore, is to provide a novel method of producing thin film integrated circuits by a simple process.

Another object of the invention is to provide a method of producing a novel passive circuit element in the thin film integrated circuits.

A further object of the invention is to provide a method of producing a novel active circuit elements in the thin film integrated circuits.

According to the features of the present invention, three layers are formed on an insulator substrate with an insulator layer present in the middle, by first depositing an anodizable metal, such as tantalum or titanium, on the insulator substrate, then anodizing a portion or whole of the surface of said first deposited metal layer to a predetermined thickness to form a second layer consisting of an oxide (or an insulator), and thereafter depositing on said second layer of the insulator thin film a metal, such as aluminum, having a high conductivity to form a third layer. Using this as a starting material, active circuit elements and passive circuit elements are provided thereon and connected to each other. Such connections are conveniently effected by making use of the first layer. Of the passive circuit elements, resistance elements are provided by the use of the first layer. The anodizable materials are advantageously used as a material for resistance due to their high resistivities. The resistance value of the resistance element may be controlled by the thickness of the oxide resulting from the anodizing. A capacitor element is provided by making use of the oxide of the first layer which is formed between the first layer and the third layer and is serving as a dielectric layer. A transistor may be provided, for example, by removing a portion of the third layer and then depositing thereon a semiconductor material, such as CdS or CdSe, to thereby produce a field effect transistor. In this instance, a source and a drain electrodes are formed by making use of the third layer, while a gate electrode is formed by making use of the first layer. In forming a thin film integrated circuit, comprising these active circuit elements and passive circuit elements, on an insulator substrate in accordance with the present invention, portions of the insulator thin film and the upper metal thin film or anodizable lower metal of the three layers on said substrate are selectively removed to provide a plurality of thin film elements and a semiconductor material is deposited on a part of these thin film elements to form thin film active elements, while utilizing the other part of the thin film elements as they are or with a partial fabrication as thin film passive elements, and a portion or the whole of said lower thin film metal is used as a common conductive portion, whereby a complete thin film integrated circuit is formed.

In order that the present invention may be better understood, a description will be given below with reference to the accompanying drawings, in which.

Figure 1:
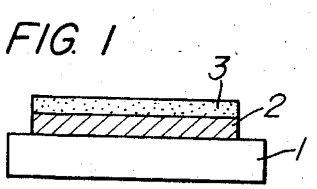
FIGURES 1 through 5 are process diagrams showing each step of a production method embodying the present invention.
Figure 2:
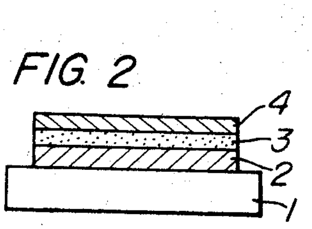
Figure 3:
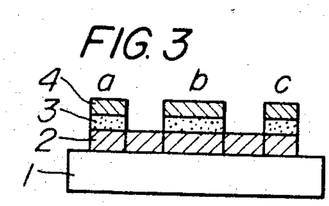
Figure 4:
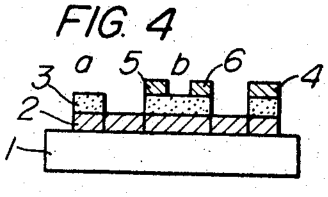
Figure 5:
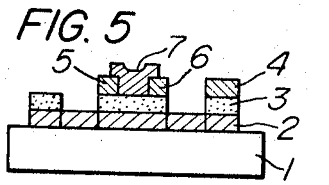
Figure 6:
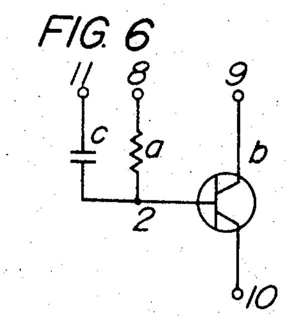
FIGURE 6 is an equivalent circuit diagram of FIGURE 5.
Figure 7:
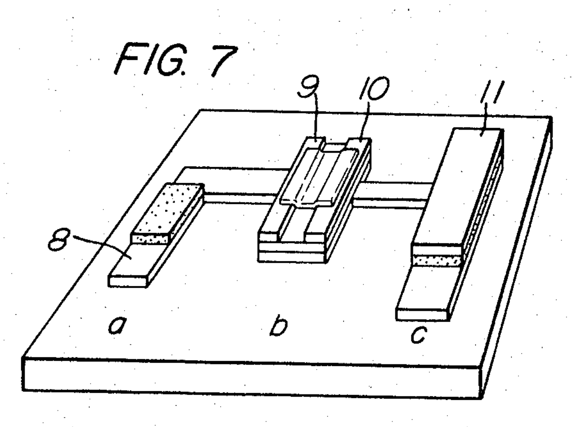
FIGURE 7 is a perspective view of FIGURE 5.

Referring now to FIGURE 1, reference numeral 1 indicates an insulator substrate which is generally made of a ceramic or boron silicate glass. The material of the insulator substrate is not restricted only to those mentioned above but single crystal substrates, such as sapphire, glazed ceramic or devitroceramic may also be used. On said insulator substrate, an anodizable metal 2, such as Ta, Nb, Zr, Ti or Al etc. is deposited. The depositing may be effected by evaporation or cathode sputtering method in a predetermined thickness to form a required sheet resistivity of the metal layer 2 and an oxide insulator layer 3. A variety of solutions is generally used for the anodizing and as an example, one form thereof is a mixture of oxalic acid, water and ethylene glycol at the ratio of 1:2:3. Citric acid, phosphoric acid or dilute nitric acid is also used. The thickness of the oxide layer 3 is a function of the anodizing solution, and the voltage, current and time used for the anodizing. Therefore, a desired thickness of the metal layer 2 can be obtained by controlling these factors. Thereafter, a metal having a good conductivity, such as aluminum, is deposited on the insulator layer 3 by evaporation to thereby form a layer 4 as shown in FIGURE 2. In the manner described, three layers consisting of the first layer of a metal, the second layer of an insulator and the third layer of a metal are formed on the insulator substrate 1. Upon completion of this, the third and second layers are removed partially by means of the photoetching technique, which is widely employed in the semiconductor industry, so as to form a plurality of thin film elements as indicated by *a*, *b* and *c* in FIGURE 3. The dimensions and areas of each of the thin film elements thus formed must be selected in accordance with the desired elementary structure. The thin film elements are then fabricated individually according to the objects which they serve respectively. For instance, a resistance which is to be formed with the element *a* can be provided by first removing the uppermost metallic thin film and then selectively removing the insulator layer and the first metal layer so that the resultant element be shaped as shown in FIGURE 7. The element *b* is the portion where an active circuit element is to be formed, the width thereof being shown wider only for the purpose of illustration. This active circuit element is provided by removing the central portion of the upper metal 4 with two conductive portions 5, 6 remaining as shown in FIGURE 4 and then a semiconductor crystal 7, e.g. a polycrystalline or a single crystalline CdSe or others, is deposited across said conductive portions 5 and 6 by means of evaporation or other means, whereupon a field effect type transistor is produced as shown in FIGURE 5, in which the first metal thin film layer 2 serves as a gate electrode and the third metallic conductors 5 and 6 as a drain electrode and a source electrode, respectively. The capacitor may be used as it is as a condenser without a necessity of further treatment. The constitutional elements obtained in the manner described, in which the thin metal film layer 2 serves as a common conductive portion, forms a functional circuit whose equivalent circuit is shown in FIGURE 6. A perspective view of the completed circuit of FIGURE 5 is shown in FIGURE 7, in which reference numerals 8, 9, 10 and 11 respectively indicate lead terminals drawn out from the resistance *a*, drain 5 and source 6 of the field effect transistor *b* and the condenser *c*.

Although the foregoing description has given with reference to a simple circuit as an example of functional circuits, it is to be understood that the method of the present invention is also applicable to the production of more complicated functional circuits comprising a plurality of thin film active elements and thin film passive elements incorporated therein.

Owing to the construction described as above, the present invention is advantageous over the prior art method of producing a thin film integrated circuit in respect of the following: Namely, in conventional methods, a passive circuit element and an active circuit element were produced separately, following which the active circuit element was mounted. In addition, the elements were made of different materials and required a number of evaporating steps, whereas according to the method of the present invention, since the essential portion of an active circuit element and a major portion of a passive circuit element are formed of the same material and all at once, the number of evaporating steps can be decreased remarkably, thus making it possible to reduce the production cost, and as the number of the interconnections can be decreased, a high reliability of circuits can be accomplished. Furthermore, the present invention has made it possible for the first time to provide the component elements of a circuit in the form of all thin films and is hence greatly advantageous in ultra-miniaturization, in the improvement in the precision and characteristics of a circuit; which are the advantageous features of thin film circuit. It is also to be noted that, as mentioned earlier, the electronic circuits according to the invention may be used for various types of electronic circuits, particularly for all digital and analog circuits using semiconductors, and further for a wide range of application including those for communication and high frequencies.

What is claimed is:

1. A method of producing a thin film functional circuit in the formation of a multiple circuit including active elements and passive elements on a substrate, comprising the steps of: forming a lower metal layer by depositing an anodizable metal on the substrate; forming an oxide insulator film of a desired thickness on the surface of said metal layer by means of anodizing method; forming an upper metal layer on said insulator film by means of evaporation; removing portions of said lower (first) metal layer, insulator film and upper metal layer selectively to thereby produce a plurality of thin film elements; forming thin film active elements by depositing on a part of a group of said thin film elements a semiconductor; and forming thin film passive elements by making use of the other part of said thin film elements as they are or by further treating a portion thereof.

2. A method for fabricating a thin film integrated circuit comprising at least one active element and at least one resistor integrally formed in combination with the active element, comprising the steps of:

depositing an anodizable metal on one surface of a substrate of insulating material to form a first metal layer;

oxidizing the entire surface of the first metal layer to a predetermined depth by means of anodic oxidation, to obtain a layer of oxide of the anodizable metal so that the first metal layer exhibits a predetermined resistivity;

depositing conductive metal on said oxide layer to form a second metal layer with a predetermined thickness;

etching said first and second metal layers and said oxide layer such that said first metal layer is divided into at least two major portions with interconnecting parts therebetween serving to conductively connect said two major portions to one another, one of said major portions of said first metal layer being covered with said oxide layer which, in turn, is covered with two separated parts of said second metal layer, the other of said major portions of said first metal layer being formed to provide a predetermined resistance; and depositing a semiconductor material on said oxide layer, said semiconductor material connecting said two separated parts of said second metal layer, thus producing a thin film field effect transistor wherein said first metal layer serves as the insulated gate electrode, said oxide layer serves as the insulator, said two separated parts of said second metal layer serve as the source and drain electrodes respectively and the deposited semiconductor material serves as the channel of the thin film field effect transistor.

3. A method for fabricating a thin film integrated circuit comprising at least one active element and at least one capacitor integrally formed in combination with the active element, comprising the steps of:

depositing an anodizable metal on one surface of a substrate of insulating material to form a first metal layer;

oxidizing the surface of the first metal layer to a predetermined depth, by means of anodic oxidation, to obtain a layer of oxide of said anodizable metal such that said first metal layer exhibits a predetermined resistivity;

depositing conductive metal on said oxide layer to form a second metal layer with a predetermined thickness;

etching said first and second metal layers and said oxide layer such that said first metal layer is divided into at least two major portions with itnerconnecting parts therebetween serving to conductively connect said two major portions to one another, said major portions of said first metal layer being covered with said oxide layer which, in turn, is covered on one major portion with at least two separated parts of said second metal layer, the other major portion of said first metal layer being formed to exhibit a predetermined capacitance in conjunction with the overlying portion of said second metal layer; and depositing a semiconductor material on said oxide layer, said semiconductor material connecting said two separated parts of said second metal layer on said oxide layer, thus producing a thin film field effect transistor wherein said first metal layer serves as the insulated gate electrode, said oxide layer serves as the insulator, said two separated parts of said second metal layer serve as the source and drain electrodes respectively and the deposited semiconductor material serves as the channel of the thin film field effect transistor.

References Cited

UNITED STATES PATENTS 3,169,892 2/1965 Lemelson ------------ 29—577

OTHER REFERENCES

"Principles of Solid-State Microelectronics," book by S. N. Levine, published 1963 by Holt, Rinehart and Winston, New York, N.Y., et al., pp. 176, 177 and 178.

WILLIAM I. BROOKS, *Primary Examiner.*

U.S. Cl. X.R.

29—577, 589, 626